United States Patent
Chen et al.

(10) Patent No.: US 9,239,356 B2
(45) Date of Patent: Jan. 19, 2016

(54) TEST BOARD

(71) Applicant: Wistron Corporation, New Taipei (TW)

(72) Inventors: I-Ming Chen, New Taipei (TW);
Chun-Kuan Liu, New Taipei (TW);
Kun-Liang Lai, New Taipei (TW)

(73) Assignee: Wistron Corporation, New Taipei (TW)

( * ) Notice: Subject to any disclaimer, the term of this patent is extended or adjusted under 35 U.S.C. 154(b) by 98 days.

(21) Appl. No.: 13/904,011

(22) Filed: May 28, 2013

(65) Prior Publication Data

US 2014/0132292 A1  May 15, 2014

(30) Foreign Application Priority Data

Nov. 9, 2012  (TW) ............................. 101141854 A

(51) Int. Cl.
*G01R 31/28* (2006.01)
*H04M 3/30* (2006.01)

(52) U.S. Cl.
CPC ........... *G01R 31/2825* (2013.01); *H04M 3/308* (2013.01)

(58) Field of Classification Search
USPC .............. 324/750.3, 538, 418, 415, 756, 537, 324/140 R, 713, 76.11; 73/114.58, 626, 73/771; 455/67.11; 365/201, 191, 189.09, 365/189.02, 189.07; 327/306, 291, 407; 307/112
See application file for complete search history.

(56) References Cited

U.S. PATENT DOCUMENTS

| | | | |
|---|---|---|---|
| 7,034,559 B2* | 4/2006 | Frankowsky et al. | 324/750.3 |
| 7,349,670 B2* | 3/2008 | Mlinarsky et al. | 455/67.11 |
| 2009/0017862 A1* | 1/2009 | Yaginuma et al. | 455/523 |
| 2009/0058918 A1* | 3/2009 | Shamoun | 347/19 |

OTHER PUBLICATIONS

National Instruments, "DAQ M Series," Jul. 2008, pp. 1-3.
"Office Action of Taiwan Counterpart Application", issued on Jul. 8, 2015, with English translation thereof, p. 1-p. 10, in which the listed references were cited.
"Office Action of China Counterpart Application" with English translation, issued on Sep. 29, 2015, p1-p10.

* cited by examiner

*Primary Examiner* — Melissa Koval
*Assistant Examiner* — Nasima Monsur
(74) *Attorney, Agent, or Firm* — Jianq Chyun IP Office

(57) ABSTRACT

The test board serves as an interface for testing a conference phone. The test board includes a plurality of test channel selectors. Each of the test channel selectors receives a plurality of test voltages provided by the conference phone and a first and a second control signals. The test voltages are divided into a plurality test voltage pairs, and each of the test channel selectors selects one of the test voltages in each of the test voltage pairs for generating a plurality of selected voltages according to the first control signal. Each of the test channel selectors selects two of the selected voltages for generating a first and a second output voltages according to the second control signal, where the first and the second output voltages are transmitted to a test machine for testing the conference phone.

13 Claims, 9 Drawing Sheets

TEST BOARD

CROSS-REFERENCE TO RELATED APPLICATION

This application claims the priority benefit of Taiwan application serial no. 101141854, filed on Nov. 9, 2012. The entirety of the above-mentioned patent application is hereby incorporated by reference herein and made a part of this specification.

BACKGROUND

1. Technical Field

The invention relates to a test board structure. Particularly, the invention relates to a test apparatus for a conference phone and a test board structure thereof.

2. Related Art

In a conventional test field of a conference phone, a PCI/PXI-6229 interface card developed by national instruments is generally configured on a computer device to serve as a test machine. The PCI/PXI-6229 interface card has a fixed number of analog input ports (for example, 32 ports) and a fixed number of digital input output ports (for example, 48 ports). However, as functions of the conference phone become more powerful, the number of signals used for testing the conference phone is increased. In this case, it is inadequate to directly use the analog input ports provided by the PCI/PXI-6229 interface card to test voltages and/or currents of the conference phone.

Therefore, in order to test the conference phone having more functions, in the conventional technical field, an interface card having more numbers of the analog input ports and/or the digital input output ports has to be used for testing. Taking the PCI/PXI-6229 interface card as an example, the PCI/PXI-6229 interface card having more numbers of the analog input ports (for example, more than 32 ports) and/or the digital input output ports (for example, more than 48 ports) are very expensive in price, which increases the test cost.

SUMMARY

The invention is directed to a test device for a conference phone and a test board thereof to serve as an interface for testing a conference phone, by which a test machine that provides limited test channels is capable of effectively testing the conference phone having more signal channels, so as to decrease test cost.

The invention provides a test board, which serves as an interface for testing a conference phone. The test board includes a plurality of test channel selectors. Each of the test channel selectors receives a plurality of test voltages transmitted by the conference phone and a first and second control signals. The test voltages are divided into a plurality test voltage pairs, and each of the test channel selectors selects one of the test voltages in each of the test voltage pairs according to the first control signal for generating a plurality of selected voltages. Each of the test channel selectors selects two of the selected voltages according to the second control signal for generating a first and second output voltages, where the first and second output voltages are transmitted to a test machine for testing the conference phone.

The invention provides a test device for a conference phone, which serves as an interface for testing the conference phone, and includes a plurality of test channel selecting modules. Each of the test channel selecting modules includes a plurality of first test channel selectors and a second test channel selector. Each of the first test channel selectors receives a plurality of test voltages transmitted by the conference phone and a first, second and third control signals. The test voltages are divided into a plurality of test voltage pairs, and each of the first test channel selectors selects one of the test voltages in each of the test voltage pairs according to the first control signal for generating a plurality of first selected voltages, and selects four of the first selected voltages according to the second control signal for generating a plurality of second selected voltages, and selects two of the second selected voltages according to the third control signal for generating a plurality of third selected voltages. The second test channel selector is coupled to the first test channel selectors, and receives the third selected voltages, and a fourth and fifth control signals. The third selected voltages are divided into a plurality of test voltage pairs, and each of the second test channel selectors selects one of the test voltages in each of the test voltage pairs according to the fourth control signal for generating a plurality of fourth selected voltages, and selects two of the fourth selected voltages according to the fourth control signal for generating a first and second output voltages.

According to the above descriptions, the test board having a plurality of test channel selectors is used to hierarchically select a plurality of test voltages transmitted by the conference phone, and the test voltages can be provided to the test machine in batches for testing. The test board of the invention can use limited number of the control signal in collaboration with limited number of analog input ports provided by a PCI/PXI-6229 interface card for testing the test voltages output by the conference phone. In this way, it is unnecessary to expand the analog input ports of the PCI/PXI-6229 and increase the number of the control signals in response to the number of the test voltages output by the conference phone, by which the test cost is effectively saved to improve price competitiveness of the conference phone.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
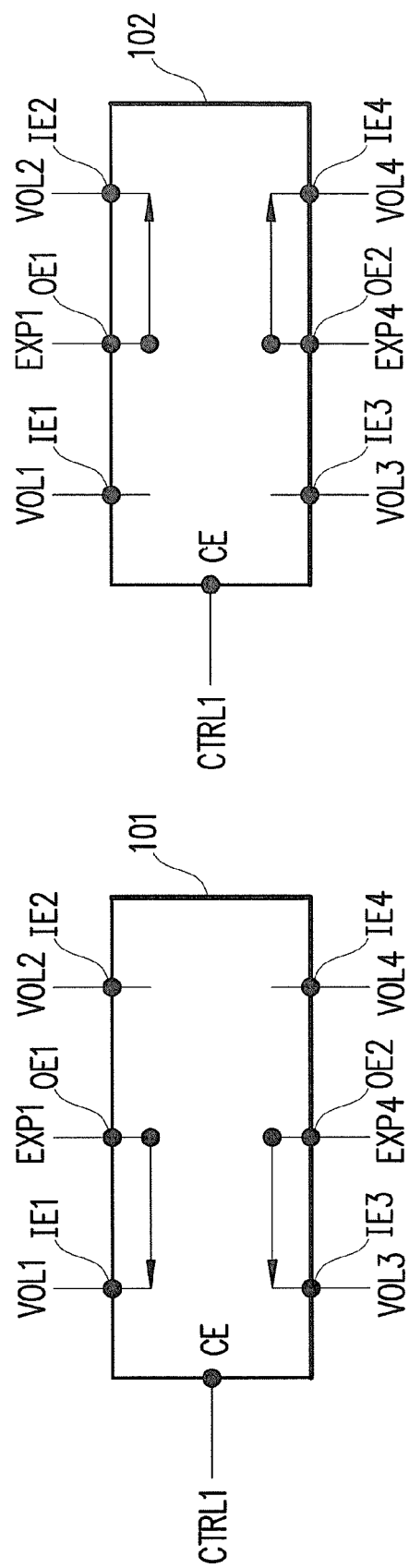
FIG. 1 is a schematic diagram illustrating operation of a relay according to an embodiment of the invention.

Referring to FIG. 1, FIG. 1 is a schematic diagram illustrating operation of a relay according to an embodiment of the invention. In a relay 101, the relay 101 has input ends IE1, IE2, IE3 and IE4, output ends OE1 and OE2 and a control end CE. The control end CE of the relay 101 receives a control signal CTRL1 to connect the input end IE1 to the output end OE1, and connect the input end IE3 to the output end OE2. In this way, test voltages VOL1 and VOL3 received through the input ends IE1 and IE3 of the relay 101 can be respectively transmitted to the output ends OE1 and OE2 of the relay 101. Comparatively, a relay 102 also has the input ends IE1, IE2, IE3 and IE4, the output ends OE1 and OE2 and the control end CE. The control end CE of the relay 102 receives the control signal CTRL1 to connect the input end IE2 to the output end OE1, and connect the input end IE4 to the output end OE2. In this way, test voltages VOL2 and VOL4 received through the input ends IE2 and IE4 of the relay 102 can be respectively transmitted to the output ends OE1 and OE2 of the relay 102.

Namely, by using the relays 101 and 102 of FIG. 1, the test voltages VOL1-VOL4 can be output in batches through the output ends OE1 and OE2 of the relays 101 and 102 for testing.

Figure 2:
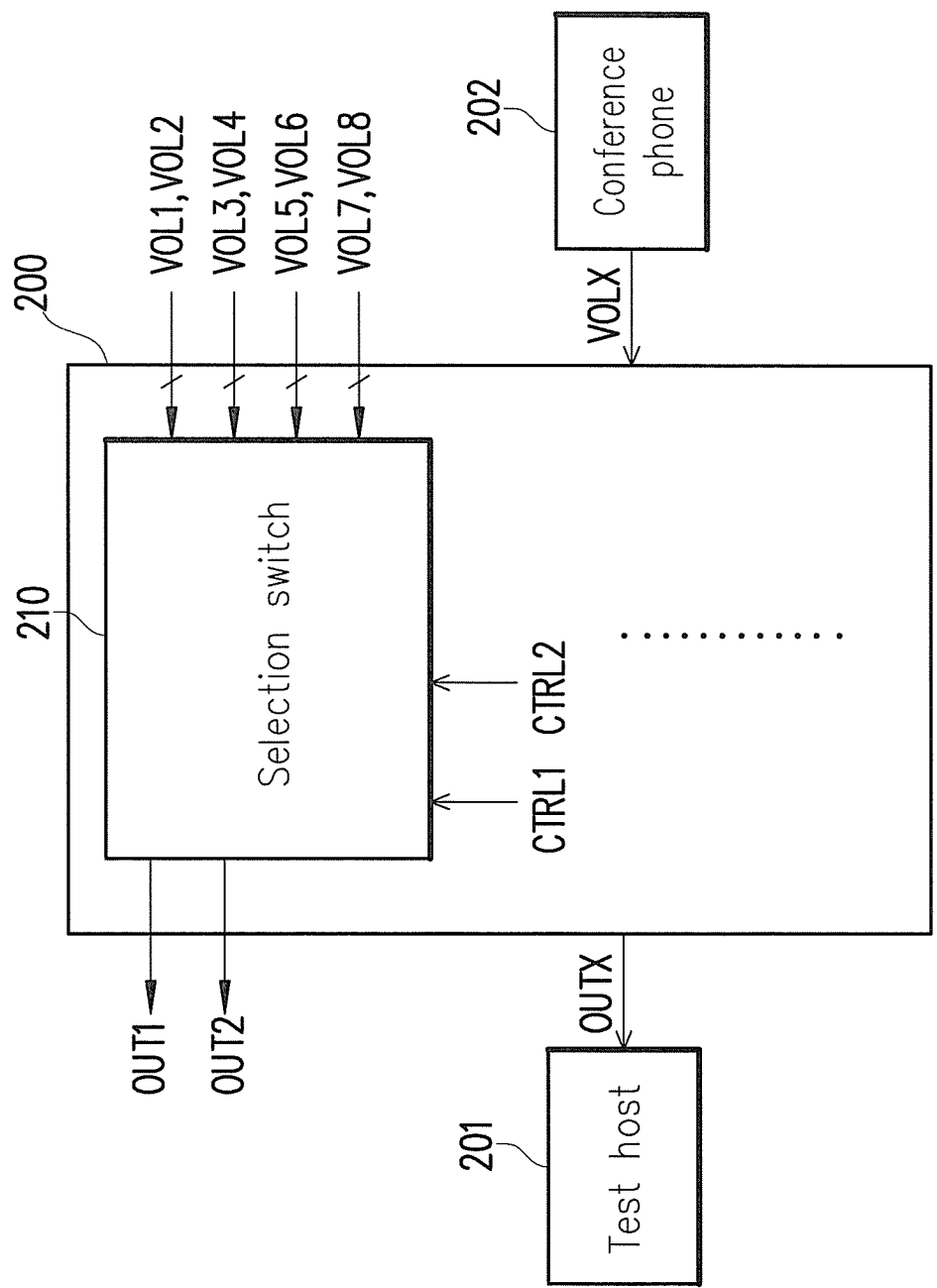
FIG. 2 is a schematic diagram of a test board 200 according to an embodiment of the invention.

Referring to FIG. 2, FIG. 2 is a schematic diagram of a test board 200 according to an embodiment of the invention. The test board 200 receives a test voltage VOLX transmitted from a conference phone 202, and outputs an output voltage OUTX to a test machine 201 for testing. The test board 200 serves as an interface for testing the conference phone 202, where the test board 200 includes a plurality of test channel selectors 210. Each of the test channel selectors 210 receives a plurality of test voltages VOL1-VOL8 transmitted by the conference phone 202 and control signals CTRL1 and CTRL2. In the present embodiment, the test voltages VOL1-VOL8 are divided into a plurality test voltage pairs, and each of the test channel selectors 210 selects one of the test voltages in each of the test voltage pairs according to the control signal CTRL1 for generating a plurality of selected voltages, and the test channel selectors 210 selects two of the selected voltages according to the control signal CTRL2 for generating two output voltages OUT1 and OUT2.

In the present embodiment, the text voltages VOLX are divided into a plurality of test voltage pairs, and the test channel selector 210 receives the test voltage pair composed of the test voltages VOL1 and VOL2, the test voltage pair composed of the test voltages VOL3 and VOL4, the test voltage pair composed of the test voltages VOL5 and VOL6, and the test voltage pair composed of the test voltages VOL7 and VOL8. The test channel selector 210 respectively selects four test voltages from the received four test voltage pairs according to the control signal CTRL1 to serve as the selected voltages. For example, the test channel selector 210 can select the test voltages VOL1, VOL3, VOL5 and VOL7 as the selected voltages according to the control signal CTRL1. Alternatively, the test channel selector 210 can select the test voltages VOL2, VOL4, VOL6 and VOL8 as the selected voltages according to the control signal CTRL1.

Moreover, the test channel selector 210 selects two test voltage from the four selected voltages according to the control signal CTRL2 for generating the output voltages OUT1 and OUT2. When the test channel selector 210 selects the test voltages VOL1, VOL3, VOL5 and VOL7 as the selected voltages, the test channel selector 210 can select the test voltages VOL1 and VOL3 to respectively serve as the output voltages OUT1 and OUT2 according to the control signal CTRL2, or select the test voltages VOL5 and VOL7 to respectively serve as the output voltages OUT1 and OUT2 according to the control signal CTRL2. When the test channel selector 210 selects the test voltages VOL2, VOL4, VOL6 and VOL8 as the selected voltages, the test channel selector 210 can select the test voltages VOL2 and VOL4 to respectively serve as the output voltages OUT1 and OUT2 according to the control signal CTRL2, or select the test voltages VOL6 and VOL8 to respectively serve as the output voltages OUT1 and OUT2 according to the control signal CTRL2.

It should be noticed that in the present embodiment, a plurality of test channel selectors 210 can be configured to serve as the test interfaces of the conference phone 202, and the single test channel selector 210 can serve as the test interface of the 8 test voltages VOL1-VOL8 generated by the conference phone 202, and through two control signals CTRL1 and CTRL2, the test machine 201 is only required to provide two corresponding analog input ports to receive the output voltages OUT1 and OUT2 for testing. The control signals CTRL1 and CTRL2 can be provided by digital output ports of the test machine 201. If a plurality of the test channel selectors 210 are configured on the test board 200, more test voltages VOLX generated by the conference phone 202 can be tested. For example, the conference phone 202 generates 64 test voltages, 8 test channel selectors 210 are required to be configured in the test board 200, and the test machine 201 is required to provide 16 control signal digital output ports and 16 analog input ports to perform the testing.

Figure 3:
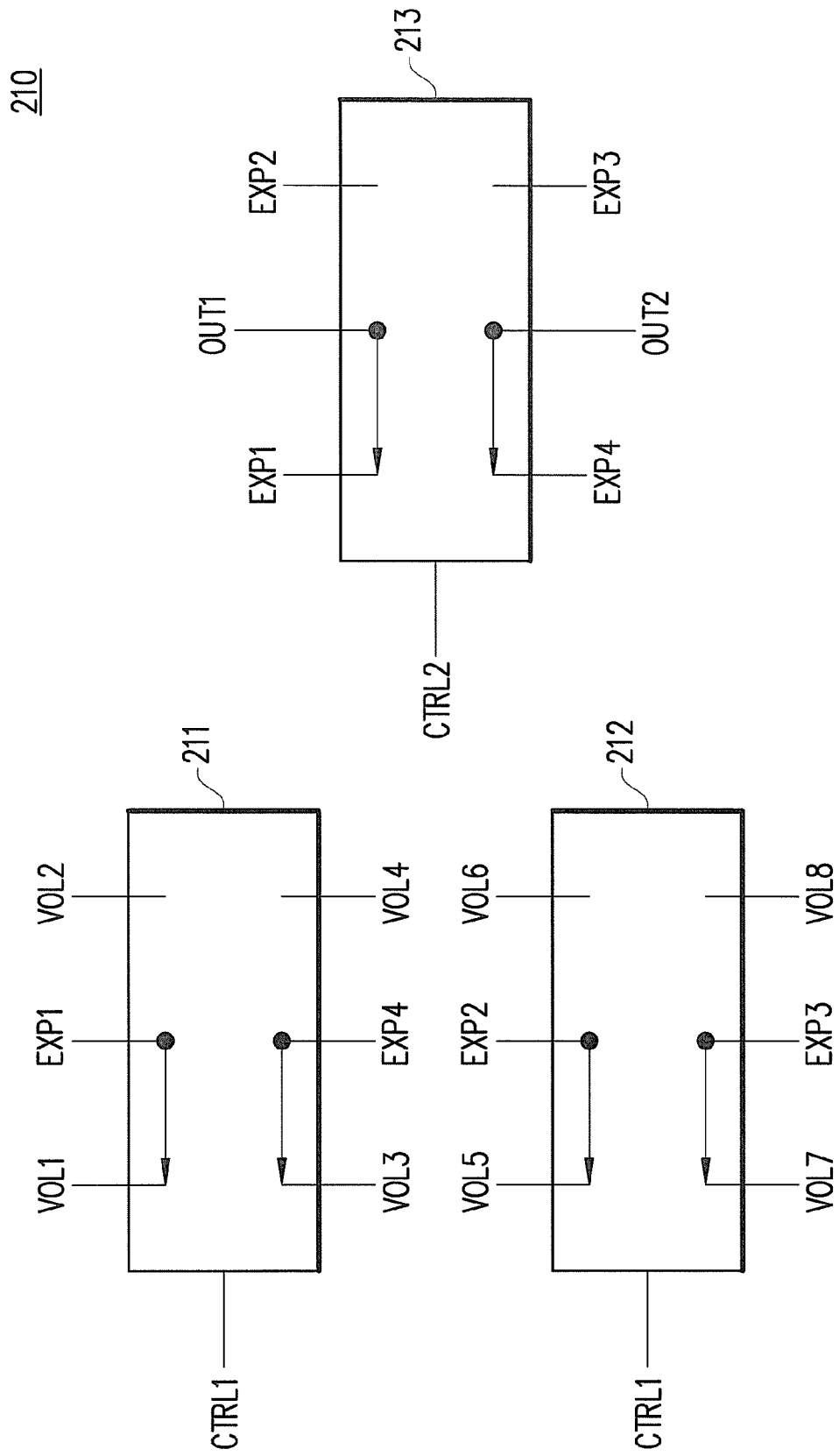
FIG. 3 is schematic diagram of a test channel selector 210 according to an embodiment of the invention.

Referring to FIG. 3, FIG. 3 is a schematic diagram of the test channel selector 210 according to an embodiment of the invention. The test channel selector 210 includes selection switches 211, 212 and 213. The selection switch 211 receives the control signal CTRL1, the test voltage pair composed of the test voltages VOL1 and VOL2, and the test voltage pair composed of the test voltages VOL3 and VOL4. The selection switch 211 respectively selects selected voltages EXP1 and EXP4 from the test voltages VOL1, VOL2 and the test voltages VOL3 and VOL4 according to the control signal CTRL1. In the present embodiment, when the selection switch 211 selects the test voltage VOL1 as the selected voltage EXP1, it simultaneously selects the test voltage VOL3 as the selected voltage EXP4. Comparatively, when the selection switch 211 selects the test voltage VOL2 as the selected voltage EXP1, it simultaneously selects the test voltage VOL4 as the selected voltage EXP4.

The selection switch 212 receives the control signal CTRL1, the test voltage pair composed of the test voltages VOL5 and VOL6, and the test voltage pair composed of the test voltages VOL7 and VOL8. The selection switch 212 respectively selects selected voltages EXP2 and EXP3 from the test voltages VOL5, VOL6 and the test voltages VOL7 and VOL8 according to the control signal CTRL1. In the present embodiment, when the selection switch 212 selects the test voltage VOL5 as the selected voltage EXP2, it simultaneously selects the test voltage VOL7 as the selected voltage EXP3. Comparatively, when the selection switch 212 selects the test voltage VOL6 as the selected voltage EXP2, it simultaneously selects the test voltage VOL8 as the selected voltage EXP3.

The selection switch 213 receives the control signal CTRL2 and the selected voltages EXP1-EXP4. The selection switch 213 selects the selected voltage EXP1 or EXP2 according to the control signal CTRL2 to generate the output voltage OUT1, and the selection switch 213 selects the selected voltage EXP4 or EXP3 according to the control signal CTRL2 to generate the output voltage OUT2.

It should be noticed that the selection switches 211-213 can all be implemented by relays.

According to the implementation of the test channel selector 210 shown in FIG. 3, a truth table of selections of the test voltages VOLT-VOL8 is shown as follows:

| CTRL1 | CTRL2 | OUT1 | OUT2 |
|---|---|---|---|
| L | L | VOL1 | VOL3 |
| L | H | VOL5 | VOL7 |
| H | L | VOL2 | VOL4 |
| H | H | VOL6 | VOL8 |

In the above truth table, "H" represents a logic high level, and "L" represents a logic low level.

Figure 4:
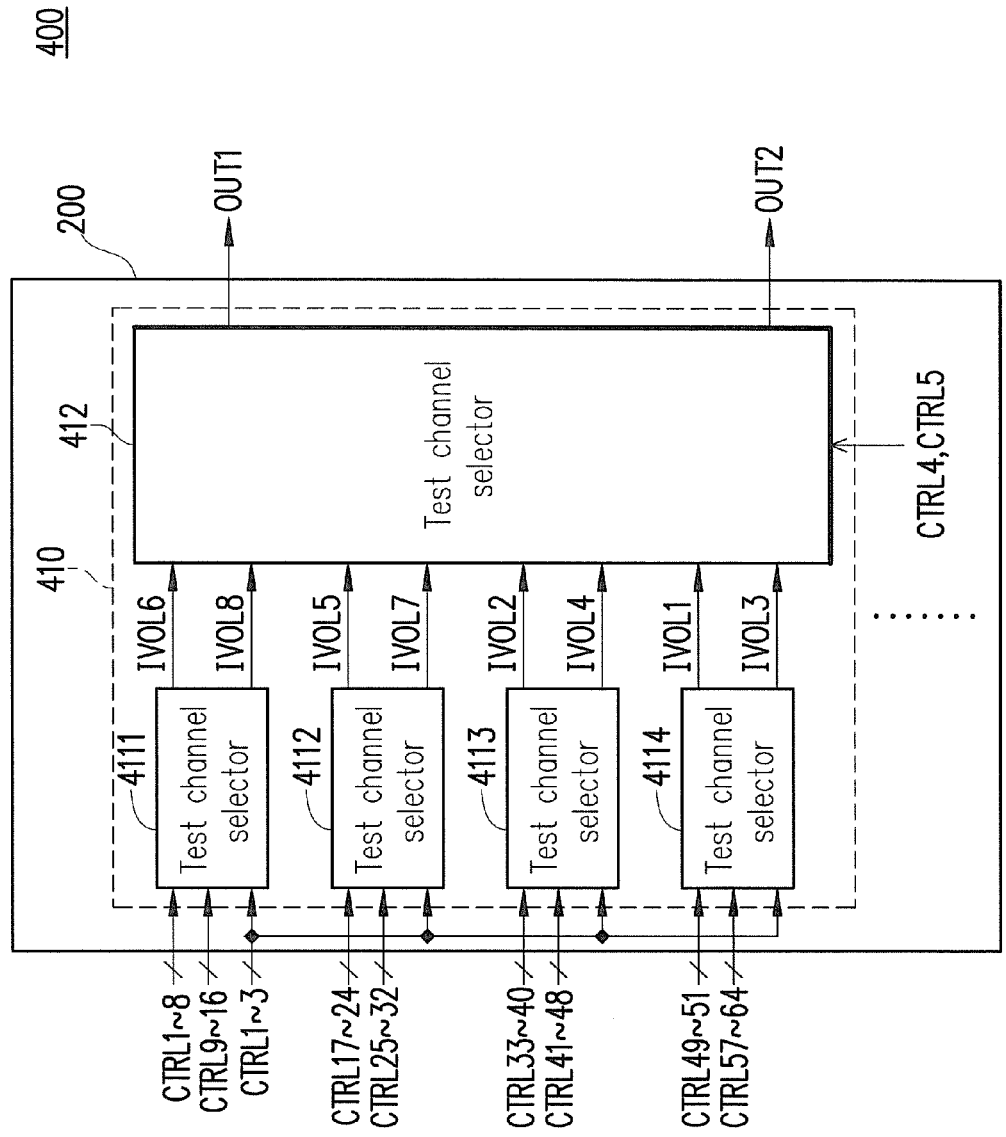
FIG. 4 is a schematic diagram of a test board 400 according to another embodiment of the invention.

Referring to FIG. 4, FIG. 4 is a schematic diagram of a test board 400 according to another embodiment of the invention. The test board 400 includes a plurality of test channel selecting modules 410. Each of the test channel selecting modules 410 includes test channel selectors 4111-4114 and a test channel selector 412. The test channel selectors 4111-4114 respectively receive test voltages VOL1-VOL16, VOL17-VOL32, VOL33-VOL48 and VOL49-VOL64, and the test channel selectors 4111-4114 commonly receive control signals CTRL1-CTRL3. The test voltages VOL1-VOL64 are sequentially divided into a plurality of test voltage pairs, and each of the test channel selectors 4111-4114 selects one of the test voltages in each of the test voltage pairs according to the control signal CTRL1 for generating a plurality of first selected voltages, and selects four of the first selected voltages according to the control signal CTRL2 for generating a plurality of second selected voltages, and selects two of the second selected voltages according to the control signal CTRL3 for generating a plurality of third selected voltages IVOL1.

In the present embodiment, the test channel selector 4111 receives the test voltages VOL1-VOL16 and selects the third selected voltages IVOL6 and IVOL8 according to the control signals CTRL1-CTRL3; the test channel selector 4112 receives the test voltages VOL17-VOL32 and selects the third selected voltages IVOL5 and IVOL7 according to the control signals CTRL1-CTRL3; the test channel selector 4113 receives the test voltages VOL33-VOL48 and selects the third selected voltages IVOL2 and IVOL4 according to the control signals CTRL1-CTRL3; the test channel selector 4114 receives the test voltages VOL49-VOL64 and selects the third selected voltages IVOL1 and IVOL3 according to the control signals CTRL1-CTRL3.

The test channel selector 412 is coupled to the test channel selectors 411, and receives the third selected voltages IVOL1-IVOL8 generated by the test channel selectors 4111-4114. Implementation details of the test channel selector 412 is the same to the that of the test channel selector 210 of FIG. 2 and FIG. 3, which selects two voltages from the third selected voltages IVOL1-IVOL8 to serve as the output voltages OUT1 and OUT2 according to two control signals (the control signal CTRL4 and CTRL5) for testing through the analog input ports of the test machine 201.

Figure 5A:
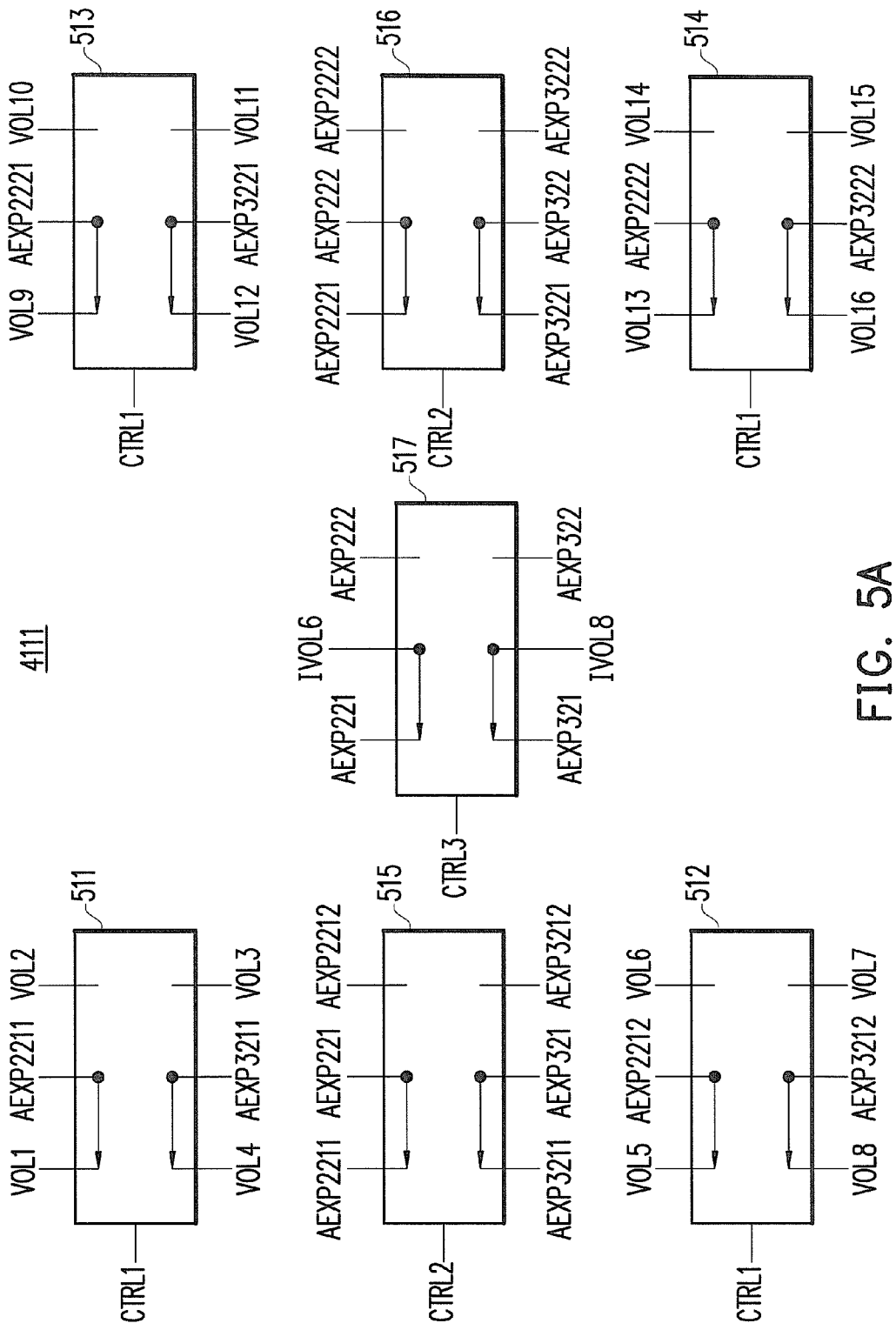
FIG. 5A-FIG. 5D are respectively implementations of test channel selectors 4111-4114 according to an embodiment of the invention.

Referring to FIG. 5A-FIG. 5D, FIG. 5A-FIG. 5D are respectively implementations of the test channel selectors 4111-4114 according to an embodiment of the invention. In FIG. 5A, the test channel selector 4111 includes first selection switches 511-514, second selection switches 515 and 516 and a third selection switch 517. The first selection switches 511-514 respectively receive test voltages VOL1-VOL4, VOL5-VOL8, VOL9-VOL12 and VOL13-VOL16. The first selection switches 511-514 commonly receive the control signal CTRL1.

The test voltages VOL1 and VOL2 form a test voltage pair, and the test voltages VOL3 and VOL4 form another test voltage pair. The first selection switch 511 selects one of the test voltages VOL1 and VOL2 to generate a first selected voltage AEXP2211 according to the control signal CTRL1, and selects one of the test voltages VOL3 and VOL4 to generate a first selected voltage AEXP3211. The test voltages VOL5 and VOL6 form a test voltage pair, and the test voltages VOL8 and VOL7 form another test voltage pair. The first selection switch 512 selects one of the test voltages VOL5 and VOL6 to generate a first selected voltage AEXP2212 according to the control signal CTRL1, and selects one of the test voltages VOL8 and VOL7 to generate a first selected voltage AEXP3212.

Moreover, the test voltages VOL9 and VOL10 form a test voltage pair, and the test voltages VOL12 and VOL11 form another test voltage pair. The first selection switch 513 selects one of the test voltages VOL9 and VOL10 to generate a first selected voltage AEXP2221 according to the control signal CTRL1, and selects one of the test voltages VOL12 and VOL11 to generate a first selected voltage AEXP3221. The test voltages VOL13 and VOL14 form a test voltage pair, and the test voltages VOL16 and VOL15 form another test voltage pair. The first selection switch 514 selects one of the test voltages VOL13 and VOL14 to generate a first selected voltage AEXP2222 according to the control signal CTRL1, and selects one of the test voltages VOL16 and VOL15 to generate a first selected voltage AEXP3222.

The second selection switch 515 receives the first selected voltages AEXP2211, AEXP2212, AEXP3211, AEXP3212 and the control signal CTRL2, and selects one of the first selected voltages AEXP2211 and AEXP2212, and one of the first selected voltages AEXP3211 and AEXP3212 according to the control signal CTRL2 to respectively serve as second selected voltages AEXP221 and AEXP321. The second selection switch 516 receives the first selected voltages AEXP2221, AEXP2222, AEXP3221, AEXP3222 and the control signal CTRL2, and selects one of the first selected voltages AEXP2221 and AEXP2222, and one of the first selected voltages AEXP3221 and AEXP3222 according to the control signal CTRL2 to respectively serve as second selected voltages AEXP222 and AEXP322.

The third selection switch 517 receives the second selected voltages AEXP221, AEXP222, AEXP321, AEXP322 and the control signal CTRL3. The third selection switch 517 selects one of the second selected voltages AEXP221 and AEXP222 to serve as a third selected voltage IVOL6 according to the control signal CTRL3, and the third selection switch 517 selects one of the second selected voltages AEXP321 and AEXP322 to serve as a third selected voltage IVOL8 according to the control signal CTRL3.

Figure 5B:
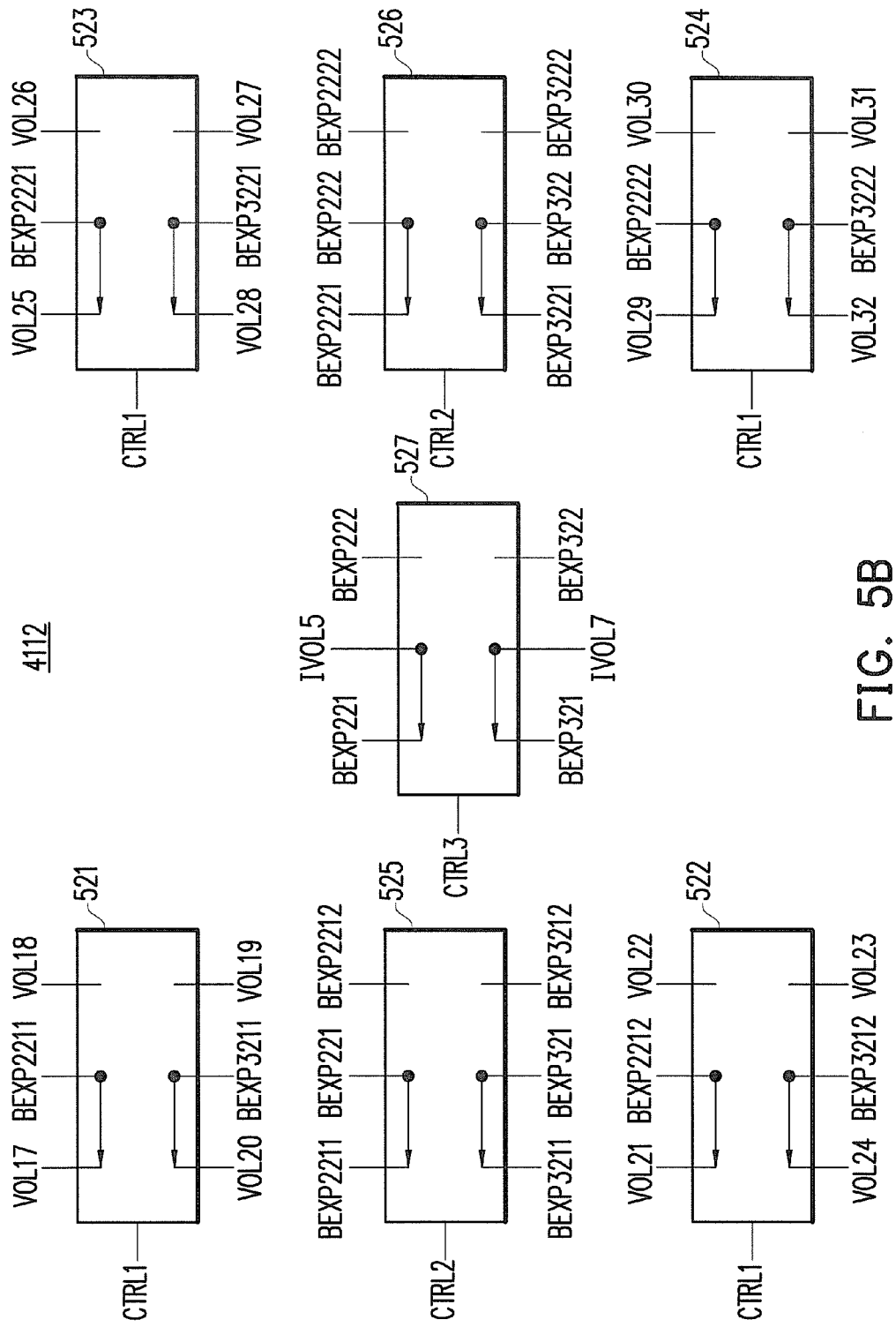

In FIG. 5B, the test channel selector 4112 includes first selection switches 521-524, second selection switches 525 and 526 and a third selection switch 527. The first selection switches 521-524 respectively receive test voltages VOL17-VOL20, VOL21-VOL24, VOL25-VOL28 and VOL29-VOL32. The first selection switches 521-524 commonly receive the control signal CTRL1.

The first selection switch 521 selects one of the test voltages VOL17 and VOL18 to generate a first selected voltage BEXP2211 according to the control signal CTRL1, and selects one of the test voltages VOL20 and VOL19 to generate a first selected voltage BEXP3211. The first selection switch 522 selects one of the test voltages VOL21 and VOL22 to generate a first selected voltage BEXP2212 according to the control signal CTRL1, and selects one of the test voltages VOL24 and VOL23 to generate a first selected voltage BEXP3212.

Moreover, the first selection switch 523 selects one of the test voltages VOL25 and VOL26 to generate a first selected voltage BEXP2221 according to the control signal CTRL1, and selects one of the test voltages VOL28 and VOL27 to generate a first selected voltage BEXP3221. The first selection switch 524 selects one of the test voltages VOL29 and VOL30 to generate a first selected voltage BEXP2222 according to the control signal CTRL1, and selects one of the test voltages VOL32 and VOL31 to generate a first selected voltage BEXP3222.

The second selection switch 525 receives the first selected voltages BEXP2211, BEXP2212, BEXP3211, BEXP3212 and the control signal CTRL2, and selects one of the first selected voltages BEXP2211 and BEXP2212, and one of the first selected voltages BEXP3211 and BEXP3212 according to the control signal CTRL2 to respectively serve as second selected voltages BEXP221 and BEXP321. The second selection switch 526 receives the first selected voltages BEXP2221, BEXP2222, BEXP3221, BEXP3222 and the control signal CTRL2, and selects one of the first selected voltages BEXP2221 and BEXP2222, and one of the first selected voltages BEXP3221 and BEXP3222 according to the control signal CTRL2 to respectively serve as second selected voltages BEXP222 and BEXP322.

The third selection switch 527 receives the second selected voltages BEXP221, BEXP222, BEXP321, BEXP322 and the control signal CTRL3. The third selection switch 527 selects one of the second selected voltages BEXP221 and BEXP222 to serve as a third selected voltage IVOL5 according to the control signal CTRL3, and the third selection switch 527 selects one of the second selected voltages BEXP321 and BEXP322 to serve as a third selected voltage IVOL7 according to the control signal CTRL3.

Figure 5C:
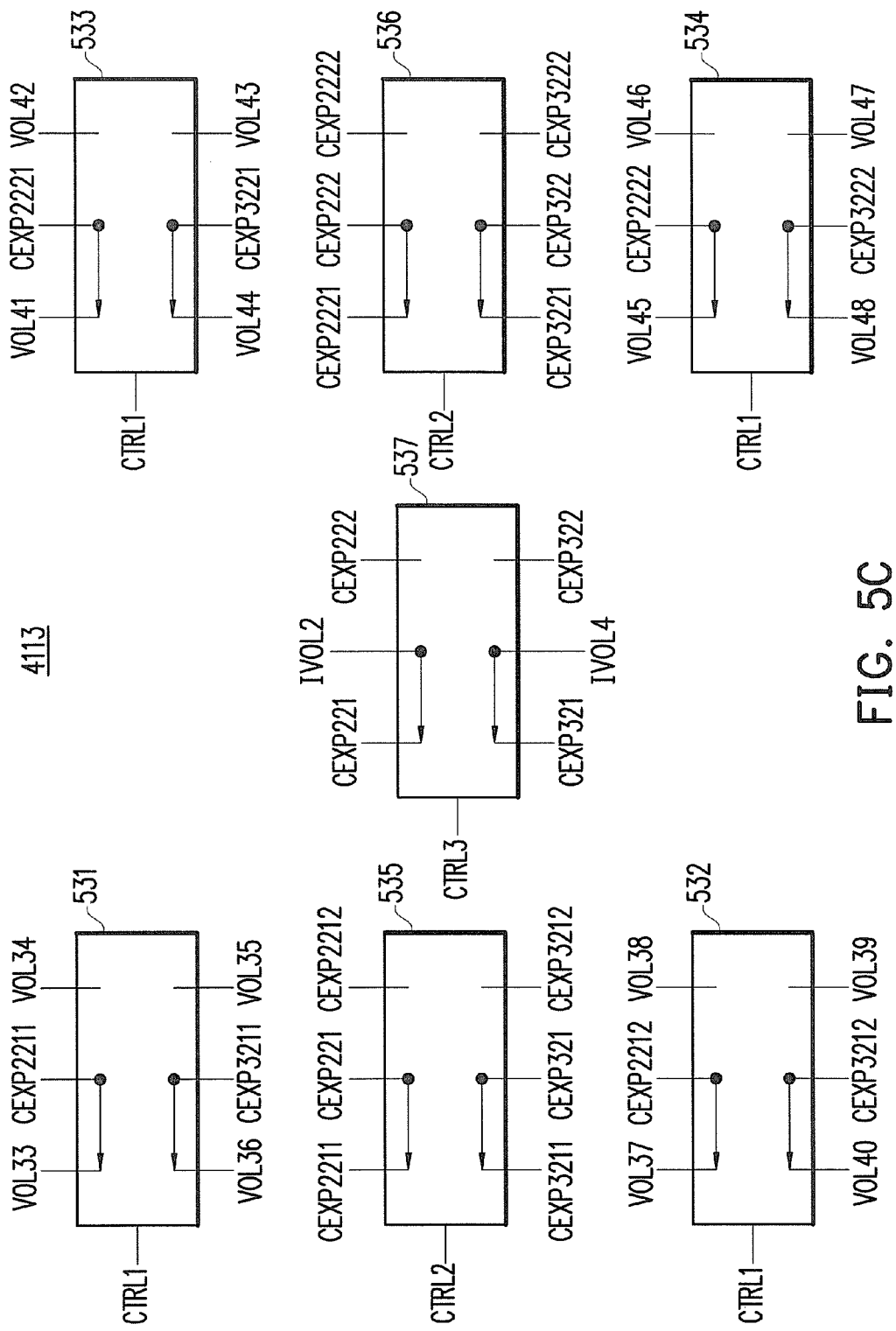

In FIG. 5C, the test channel selector 4113 includes first selection switches 531-534, second selection switches 535 and 536 and a third selection switch 537. The first selection switches 531-534 respectively receive test voltages VOL33-VOL36, VOL37-VOL40, VOL41-VOL44 and VOL45-VOL48. The first selection switches 531-534 commonly receive the control signal CTRL1.

The first selection switch 531 selects one of the test voltages VOL33 and VOL34 to generate a first selected voltage CEXP2211 according to the control signal CTRL1, and selects one of the test voltages VOL36 and VOL35 to generate a first selected voltage CEXP3211. The first selection switch 532 selects one of the test voltages VOL37 and VOL38 to generate a first selected voltage CEXP2212 according to the control signal CTRL1, and selects one of the test voltages VOL40 and VOL39 to generate a first selected voltage CEXP3212.

Moreover, the first selection switch 533 selects one of the test voltages VOL41 and VOL42 to generate a first selected voltage CEXP2221 according to the control signal CTRL1, and selects one of the test voltages VOL44 and VOL43 to generate a first selected voltage CEXP3221. The first selection switch 534 selects one of the test voltages VOL45 and VOL46 to generate a first selected voltage CEXP2222 according to the control signal CTRL1, and selects one of the test voltages VOL48 and VOL47 to generate a first selected voltage CEXP3222.

The second selection switch 535 receives the first selected voltages CEXP2211, CEXP2212, CEXP3211, CEXP3212 and the control signal CTRL2, and selects one of the first selected voltages CEXP2211 and CEXP2212, and one of the first selected voltages CEXP3211 and CEXP3212 according to the control signal CTRL2 to respectively serve as second selected voltages CEXP221 and CEXP321. The second selection switch 536 receives the first selected voltages CEXP2221, CEXP2222, CEXP3221, CEXP3222 and the control signal CTRL2, and selects one of the first selected voltages CEXP2221 and CEXP2222, and one of the first selected voltages CEXP3221 and CEXP3222 according to the control signal CTRL2 to respectively serve as second selected voltages CEXP222 and CEXP322.

The third selection switch 537 receives the second selected voltages CEXP221, CEXP222, CEXP321, CEXP322 and the control signal CTRL3. The third selection switch 537 selects one of the second selected voltages CEXP221 and CEXP222 to serve as a third selected voltage IVOL2 according to the control signal CTRL3, and the third selection switch 537 selects one of the second selected voltages CEXP321 and CEXP322 to serve as a third selected voltage IVOL4 according to the control signal CTRL3.

Figure 5D:
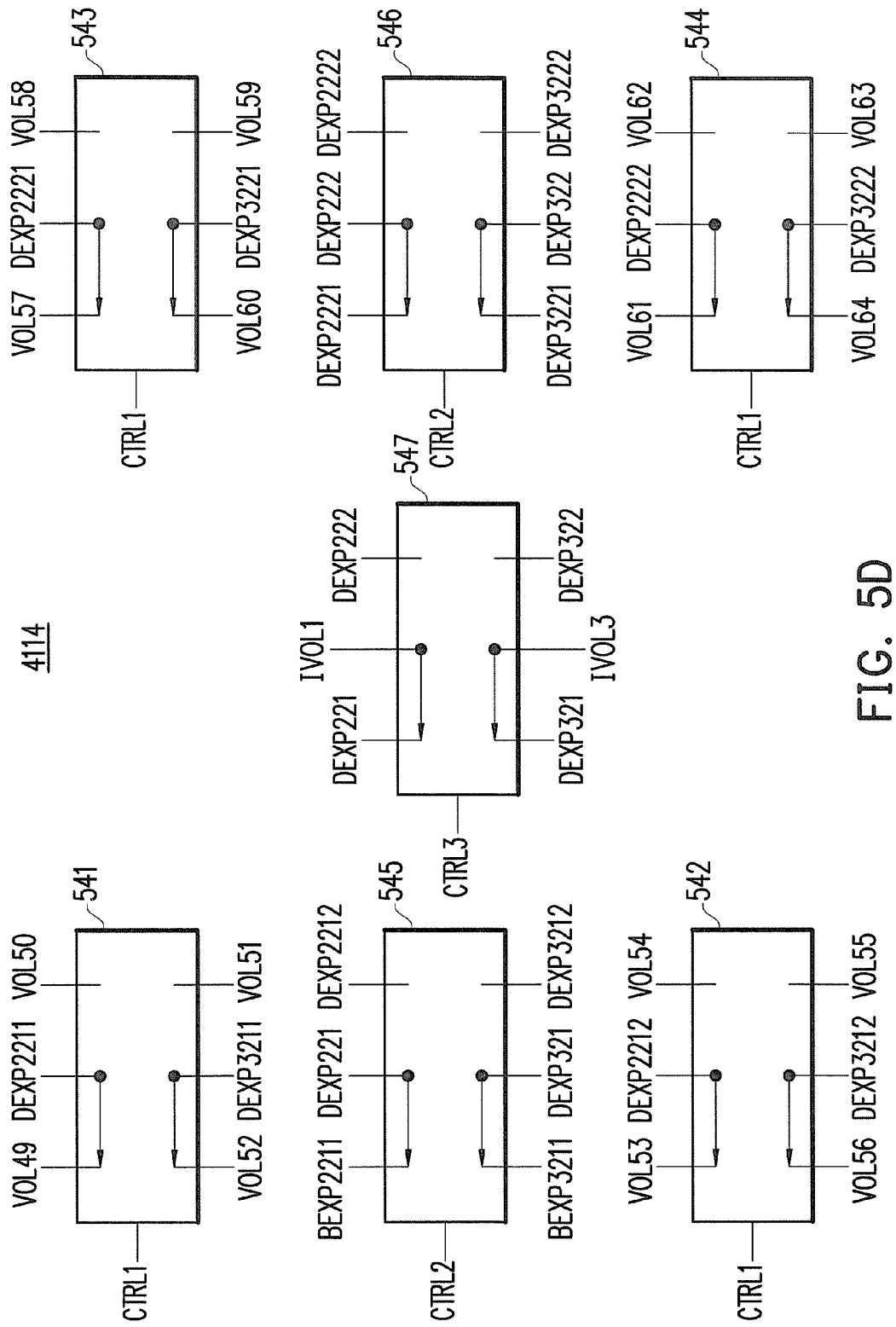

In FIG. 5D, the test channel selector 4114 includes first selection switches 541-544, second selection switches 545 and 546 and a third selection switch 547. The first selection switches 541-544 respectively receive test voltages VOL49-VOL52, VOL53-VOL56, VOL57-VOL60 and VOL61-VOL64. The first selection switches 541-544 commonly receive the control signal CTRL1.

The first selection switch 541 selects one of the test voltages VOL49 and VOL50 to generate a first selected voltage DEXP2211 according to the control signal CTRL1, and selects one of the test voltages VOL52 and VOL51 to generate a first selected voltage DEXP3211. The first selection switch 542 selects one of the test voltages VOL53 and VOL54 to generate a first selected voltage DEXP2212 according to the control signal CTRL1, and selects one of the test voltages VOL56 and VOL55 to generate a first selected voltage DEXP3212.

Moreover, the first selection switch 543 selects one of the test voltages VOL57 and VOL58 to generate a first selected voltage DEXP2221 according to the control signal CTRL1, and selects one of the test voltages VOL60 and VOL59 to generate a first selected voltage DEXP3221. The first selection switch 544 selects one of the test voltages VOL61 and VOL62 to generate a first selected voltage DEXP2222 according to the control signal CTRL1, and selects one of the test voltages VOL64 and VOL63 to generate a first selected voltage DEXP3222.

The second selection switch 545 receives the first selected voltages DEXP2211, DEXP2212, DEXP3211, DEXP3212 and the control signal CTRL2, and selects one of the first selected voltages DEXP2211 and DEXP2212, and one of the first selected voltages DEXP3211 and DEXP3212 according to the control signal CTRL2 to respectively serve as second selected voltages DEXP221 and DEXP321. The second selection switch 546 receives the first selected voltages DEXP2221, DEXP2222, DEXP3221, DEXP3222 and the control signal CTRL2, and selects one of the first selected voltages DEXP2221 and DEXP2222, and one of the first selected voltages DEXP3221 and DEXP3222 according to the control signal CTRL2 to respectively serve as second selected voltages DEXP222 and DEXP322.

The third selection switch 547 receives the second selected voltages DEXP221, DEXP222, DEXP321, DEXP322 and the control signal CTRL3. The third selection switch 547 selects one of the second selected voltages DEXP221 and DEXP222 to serve as a third selected voltage IVOL1 according to the control signal CTRL3, and the third selection switch 547 selects one of the second selected voltages DEXP321 and DEXP322 to serve as a third selected voltage IVOL3 according to the control signal CTRL3.

Figure 5E:
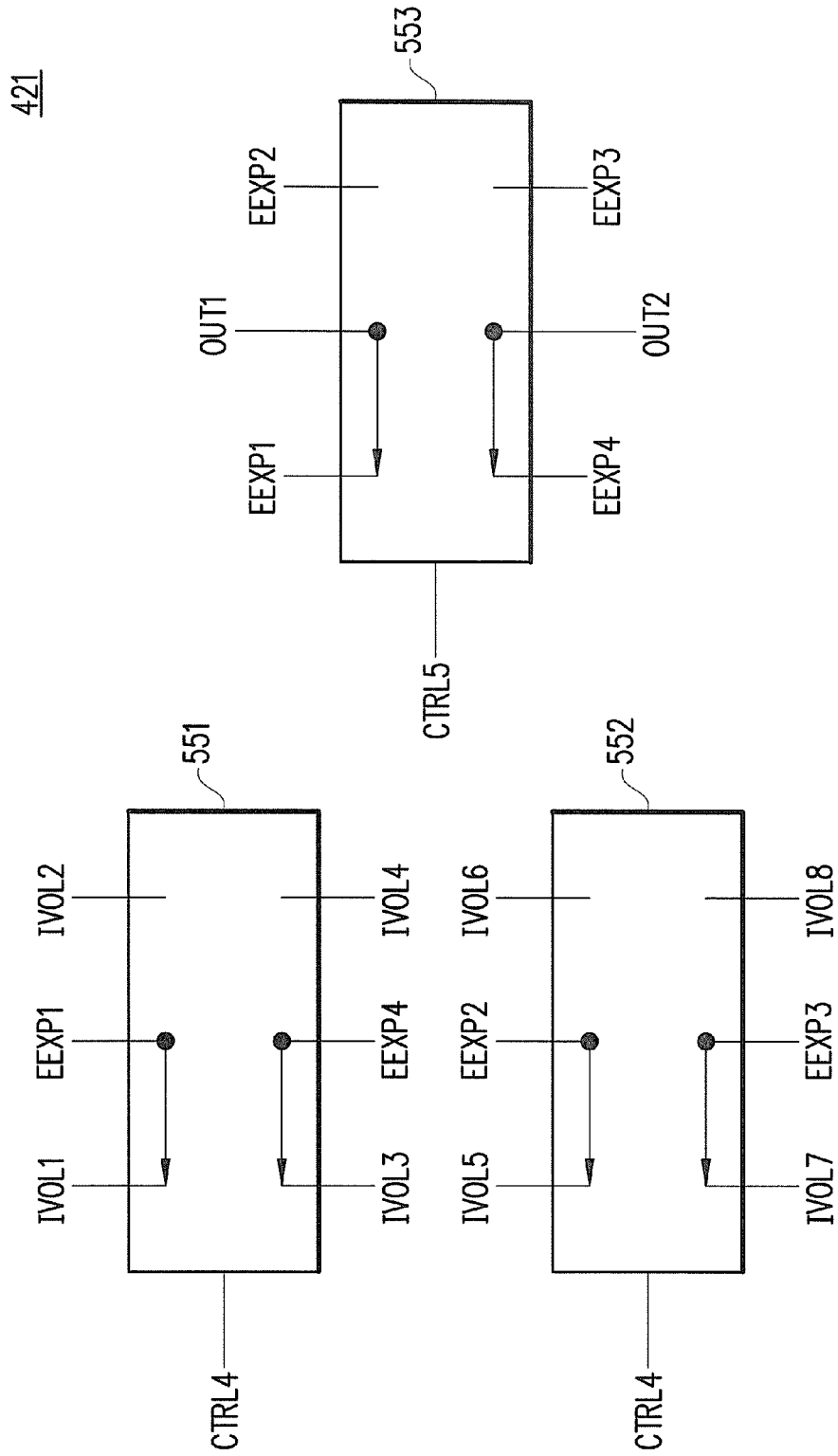
FIG. 5E is a schematic diagram of a test channel selector 412 according to an embodiment of the invention.

Referring to FIG. 5E, FIG. 5E is a schematic diagram of the test channel selector 412 according to an embodiment of the invention. The test channel selector 412 includes selection switches 551-553, where the selection switch 551 receives the control signal CTRL4 and the third selected voltages IVOL1-IVOL4, the selection switch 552 receives the control signal CTRL4 and the third selected voltages IVOL5-IVOL8, and the selection switch 553 receives the control signal CTRL5 and voltages to be tested EEXP1-EEXP4.

The selection switch 551 selects one of the third selected voltages IVOL1 and IVOL2 to generate the voltage to be tested EEXP1 according to the control signal CTRL4, and selects one of the third selected voltages IVOL3 and IVOL4 to generate the voltage to be tested EEXP4. The selection switch 552 selects one of the third selected voltages IVOL5 and IVOL6 to generate the voltage to be tested EEXP2 according to the control signal CTRL4, and selects one of the third selected voltages IVOL7 and IVOL8 to generate the voltage to be tested EEXP3.

The selection switch 553 selects one of the voltages to be tested EEXP1 and EEPX2 to generate the output voltage OUT1 according to the control signal CTRL5, and selects one of the voltages to be tested EEXP4 and EEPX3 to generate the output voltage OUT2.

A truth table of the test channel selectors 4111-4114 and the test channel selector 412 shown in FIG. 5A-FIG. 5D is as follows:

| CTRL5 | CTRL4 | CTRL3 | CTRL2 | CTRL1 | OUT1 | OUT2 |
|---|---|---|---|---|---|---|
| H | H | L | L | L | VOL1 | VOL4 |
| H | H | L | L | H | VOL2 | VOL3 |
| H | H | L | H | L | VOL5 | VOL8 |
| H | H | L | H | H | VOL6 | VOL7 |
| H | H | H | L | L | VOL9 | VOL12 |
| H | H | H | L | H | VOL10 | VOL11 |
| H | H | H | H | L | VOL13 | VOL16 |
| H | H | H | H | H | VOL14 | VOL15 |
| H | L | L | L | L | VOL17 | VOL20 |
| H | L | L | L | H | VOL18 | VOL19 |
| H | L | L | H | L | VOL21 | VOL24 |
| H | L | L | H | H | VOL22 | VOL23 |
| H | L | H | L | L | VOL25 | VOL28 |
| H | L | H | L | H | VOL26 | VOL27 |
| H | L | H | H | L | VOL29 | VOL32 |
| H | L | H | H | H | VOL30 | VOL31 |
| L | H | L | L | L | VOL33 | VOL36 |
| L | H | L | L | H | VOL34 | VOL35 |
| L | H | L | H | L | VOL37 | VOL40 |
| L | H | L | H | H | VOL38 | VOL39 |
| L | H | H | L | L | VOL41 | VOL44 |
| L | H | H | L | H | VOL42 | VOL43 |
| L | H | H | H | L | VOL45 | VOL48 |
| L | H | H | H | H | VOL46 | VOL47 |
| L | L | L | L | L | VOL49 | VOL52 |
| L | L | L | L | H | VOL50 | VOL51 |
| L | L | L | H | L | VOL53 | VOL56 |
| L | L | L | H | H | VOL54 | VOL55 |
| L | L | H | L | L | VOL58 | VOL60 |
| L | L | H | L | H | VOL56 | VOL59 |
| L | L | H | H | L | VOL61 | VOL64 |
| L | L | H | H | H | VOL62 | VOL63 |

In the above truth table, "H" represents a logic high level, and "L" represents a logic low level.

It should be noticed all of the selection switches of FIG. 5A-FIG. 5E can all be implemented by relays.

According to the above embodiments, in case that 5 control signals are provided and the test machine provides two analog input ports, the test board 400 of the present embodiment can serve as a test interface for the conference phone providing 64 voltages to be tested. In this way, in case that the test machine can only provide a limited test resource, more analog-format test voltages can be tested, which effectively decreases the cost probably caused by improving the testing capability of the test machine (for example, increasing the number of the analog input ports).

In summary, the test board of the test channel selectors having at least multi-hierarchy is used as an interface for testing the conference phone. In this way, in case that the test machine has a fixed number of test channels, the conference phones of different specifications can still be tested, which effectively enhances compatibility of the test operation. Moreover, in case that a hardware structure of the test machine is not changed, the conference phones of different specifications can still be tested, which effectively saves the test cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A test board, serving as an interface for testing a conference phone, comprising:
a plurality of test channel selectors, each of the test channel selectors receiving a plurality of test voltages transmitted by the conference phone and a first and second control signals, the test voltages being grouped into a plurality test voltage pairs and each of the test voltage pairs comprising two of the test voltages, and each of the test channel selectors directly selecting one of the test voltages in each of the test voltage pairs according to the first control signal for generating a plurality of selected voltages, and each of the test channel selectors selecting two of the selected voltages according to the second control signal for generating a first and second output voltages,
wherein the first and second output voltages are transmitted to a test machine for testing the conference phone, and each of the test channel selectors comprises:
a first selection switch, receiving the first control signal and a first and second test voltage pairs of the test voltage pairs, and the first selection switch respectively selecting a first and a fourth selected voltage of the selected voltages in the first and second test voltage pairs according to the first control signal;
a second selection switch, receiving the first control signal and a third and fourth test voltage pairs of the test voltage pairs, and the second selection switch respectively selecting a second and a third selected voltage of the selected voltages in the third and fourth test voltage pairs according to the second control signal;
a third selection switch, receiving the second control signal and the first, second, third and fourth selected voltages, and the third selection switch selecting the first or the second selected voltage to generate the first output voltage according to the second control signal, and selecting the third or the fourth selected voltage to generate the second output voltage according to the second control signal.

2. The test board as claimed in claim 1, wherein when the first selection switch respectively selects a first test voltage of the first test voltage pair and a third test voltage of the second test voltage pair as the first and the fourth selected voltages, the second selection switch respectively selects a fifth test voltage of the third test voltage pair and a seventh test voltage of the fourth test voltage pair as the second and the third selected voltages.

3. The test board as claimed in claim 1, wherein when the first selection switch respectively selects a second test voltage of the first test voltage pair and a fourth test voltage of the second test voltage pair as the first and the fourth selected voltages, the second selection switch respectively selects a sixth test voltage of the third test voltage pair and an eighth test voltage of the fourth test voltage pair as the second and the third selected voltages.

4. The test board as claimed in claim 1, wherein when the third selection switch selects the first selected voltage as the first output voltage according to the second control signal, the third selection switch selects the fourth selected voltage as the second output voltage.

5. The test board as claimed in claim 1, wherein when the third selection switch selects the second selected voltage as the first output voltage according to the second control signal, the third selection switch selects the third selected voltage as the second output voltage.

6. The test board as claimed in claim 1, wherein the first, the second and the third selection switches are respectively a plurality of relays.

7. The test board as claimed in claim 6, wherein each of the relays has a first input end, a second input end, a third input end, a fourth input end, a control end, a first output end and a second output end, and each of the relays shorts the first input end to the first output end and shorts the third input end to the first output end according to a voltage received by the control end of each of the relays, or each of the relays shorts the second input end to the first output end and shorts the fourth input end to the second output end according to the voltage received by the control end of each of the relays.

8. A test board, serving as an interface for testing a conference phone, comprising:
   a plurality of test channel selecting modules, each comprising:
   a plurality of first test channel selectors, each of the first test channel selectors receiving a plurality of test voltages transmitted by the conference phone and a first, a second and a third control signals, the test voltages being grouped into a plurality of test voltage pairs and each of the test voltage pairs comprising two of the test voltages, and each of the first test channel selectors directly selecting one of the test voltages in each of the test voltage pairs according to the first control signal for generating a plurality of first selected voltages, and selecting four of the first selected voltages according to the second control signal for generating a plurality of second selected voltages, and selecting two of the second selected voltages according to the third control signal for generating a plurality of third selected voltages; and
   a second test channel selector, coupled to the first test channel selectors, and receiving the third selected voltages, and a fourth and a fifth control signals, wherein the third selected voltages are divided into a plurality of test voltage pairs, and each of the second test channel selectors selects one of the test voltages in each of the test voltage pairs according to the fourth control signal for generating a plurality of fourth selected voltages, and selects two of the fourth selected voltages according to the fourth control signal for generating a first and a second output voltages,
   wherein each of the first test channel selectors comprises:
   a plurality of first selection switches, each having a first to fourth input ends, a first to second output ends and a control end, wherein the control end receives the first control signal, the first and second input ends receive one of the test voltage pairs, and the third and the fourth input end receive the other one of the test voltage pairs, the first output end transmits a voltage on the first input end or the second input end, and the second output end transmits a voltage on the third input end or the fourth input end, wherein the first and the second output ends of the first selection switches generate the first selected voltages;
   a plurality of second selection switches, each having a first to fourth input ends, a first to second output ends and a control end, wherein the control end receives the second control signal, the first and second input ends receive two of the first selected voltages, and the third and the fourth input end receive the other two of the first selected voltages, the first output end transmits a voltage on the first input end or the second input end, and the second output end transmits a voltage on the third input end or the fourth input end, wherein the first and the second output ends of the second selection switches generate the second selected voltages; and
   a third selection switch, selecting two of the second selected voltages as the third selected voltages according to the third control signal.

9. The test board as claimed in claim 8, wherein the first, the second and the third selection switches are a plurality of relays.

10. The test board as claimed in claim 9, wherein each of the relays has a first input end, a second input end, a third input end, a fourth input end, a control end, a first output end and a second output end, and each of the relays shorts the first input end to the first output end and shorts the third input end to the first output end according to a voltage received by the control end thereof, or each of the relays shorts the second input end to the first output end and shorts the fourth input end to the second output end according to the voltage received by the control end of each of the relays.

11. The test board as claimed in claim 8, wherein each of the second test channel selectors comprises:
   a fourth selection switch, receiving the fourth control signal and the third selected voltages, and selecting a first and a fourth voltages to be tested from the third selected voltages according to the fourth control signal;
   a fifth selection switch, selecting a second a third voltage to be tested from the third selected voltages according to the fourth control signal; and
   a sixth selection switch, selecting the first or the second voltage to be tested to generate the first output voltage according to the fifth control signal, and selecting the third or the fourth voltage to be tested to generate the second output voltage according to the fifth control signal.

12. The test board as claimed in claim 10, wherein the fourth, the fifth and the sixth selection switches are all relays.

13. The test board as claimed in claim 12, wherein each of the relays has a first input end, a second input end, a third input end, a fourth input end, a control end, a first output end and a second output end, and each of the relays shorts the first input end to the first output end and shorts the third input end to the first output end according to a voltage received by the control end of each of the relays, or each of the relays shorts the second input end and the first output end and shorts the fourth input end and the second output end according to the voltage received by the control end of each of the relays.

\* \* \* \* \*